United States Patent [19]

Koh et al.

[11] Patent Number: 5,527,738
[45] Date of Patent: Jun. 18, 1996

[54] METHOD FOR FORMING CONTACTS IN SEMICONDUCTOR DEVICES

[75] Inventors: Yo H. Koh; Chan K. Park; Seong M. Hwang; Kwang M. Rho, all of Kyoungkido, Rep. of Korea

[73] Assignee: Hyundai Electronics Industries Co., Ltd., Kyoungkido, Rep. of Korea

[21] Appl. No.: 326,871

[22] Filed: Oct. 21, 1994

[30] Foreign Application Priority Data

Oct. 21, 1993 [KR] Rep. of Korea ............... 1993-21960

[51] Int. Cl.⁶ .................................................. H01L 21/44
[52] U.S. Cl. ........................................... 437/195; 437/228
[58] Field of Search ........................... 437/195, 978, 437/235, 245, 228, 228 S, 228 CON

[56] References Cited

U.S. PATENT DOCUMENTS 4,962,060  10/1990  Silwa et al. .
5,019,527  5/1991  Ohshima et al. ............... 437/43
5,331,116  7/1994  Haslam et al. .

Primary Examiner—George Fourson
Assistant Examiner—C. Everhart
Attorney, Agent, or Firm—Merchant, Gould, Smith, Edell, Welter & Schmidt

[57] ABSTRACT

There is disclosed a method for forming a contact in a semiconductor device wherein a contact material is contacted with an area of a first conductive film between second conductive film patterns which are insulated with the first conductive film and closely adjacent to each other. The method comprises the steps of contacting with the first conductive film a first contact mediator passing by the second conductive film patterns, in a self-alignment manner, contacting a second contact mediator with a predetermined area of the first contact mediator, forming a conductive film spacer at a side wall of the second contact mediator with the contact mediator being patterned, and forming the contact material on the contact mediator.

8 Claims, 9 Drawing Sheets

4,527,738

METHOD FOR FORMING CONTACTS IN SEMICONDUCTOR DEVICES

BACKGROUND OF THE INVENTION

1. Field of the Invention

The present invention relates, in general, to methods for forming contacts in a semiconductor device through which devices are connected with each other and, more particularly, to methods for forming contacts in semiconductor device, capable of securing allowance enough to prevent from forming a short circuit between the conductive films.

2. Description of the Prior Art

Increases in the degree of integration of semiconductor devices is usually accompanied by reducing the area for the unit cell, forcing the contacts formed on a semiconductor substrate to be diminished in size. This shortens the distance between electrical conductors formed in a semiconductor device. For increases in the degree of integration, it is therefore excessively required to develop a technology which is capable of forming contacts as well as securing insulation among the electrical conductors.

Especially, in forming contacts of bit line and/or charge storage electrode between gate electrodes or between word lines in a highly integrated DRAM cell, there is increasing demand for a technology preventive of short circuits formed between the bit line or charge storage electrode and the gate electrode or word line, with enough allowance.

In order to better understand the background of the present invention, a description will be made in conjunction with a conventional formation method for contact and accompanying problems by referring FIGS. 1A through 1C.

First, on a silicon substrate 1, there are formed gate insulating films 20, gate electrodes 2, first insulating films 3 and spacer insulating films 4, as shown in FIG. 1A. Thereafter, the resulting structure of FIG. 1A is subjected to planarization by coating thereon a planarization film 13, an insulating film, which is then opened with a mask at a predetermined area to form a contact hole between the electrodes 2, followed by deposition of a conductive film 14 over the contact hole to form a contact, as shown in FIG. 1B.

However, this conventional method is highly apt to cause problems. For example, the distance between the gate electrodes 2 becomes shortened in a highly integrated semiconductor device, giving small allowance to the mask process. In other words, as a result of carrying out the mask process to form the contact hole after the coating of the planarization film 13, the contact experiences short circuit with the gate electrode, as shown in FIG. 1C (by circle 21).

SUMMARY OF THE INVENTION

An object of the present invention, therefore, is to overcome the above problems encountered in the prior art and to provide a method for forming a contact in a semiconductor device, which is characterized by utilizing multi-contact mediators, that secure sufficient allowance to prevent the formation of a short circuit.

In accordance with the present invention, the above object could be accomplished by the provision of a method for forming a contact in a semiconductor device wherein a contact material is contacted with an area of a first conductive film between second conductive film patterns which are insulated by the first conductive film and closely adjacent to each other, comprising the steps of: contacting with the first conductive film a first contact mediator passing by the second conductive film patterns, in a self-alignment manner; contacting a second contact mediator with a predetermined area of the first contact mediator; forming a conductive film spacer at a side wall of the second contact mediator with said contact mediator being patterned; and forming the contact material on said contact mediator.

BRIEF DESCRIPTION OF THE DRAWINGS

The above object and other advantages of the present invention will become more apparent by describing in detail the preferred embodiment of the present invention with reference to the attached drawings in which.

DETAILED DESCRIPTION OF THE PREFERRED EMBODIMENTS

Figure 1A:
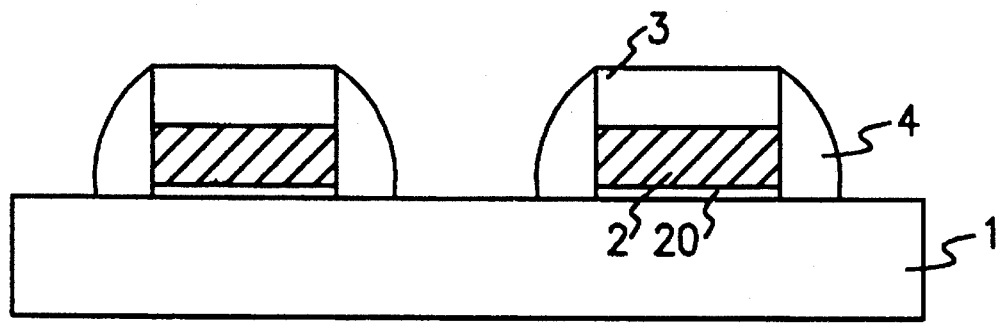
FIGS. 1A through 1C are schematic cross sectional views illustrating a conventional formation method for contact in a semiconductor device.
Figure 1B:
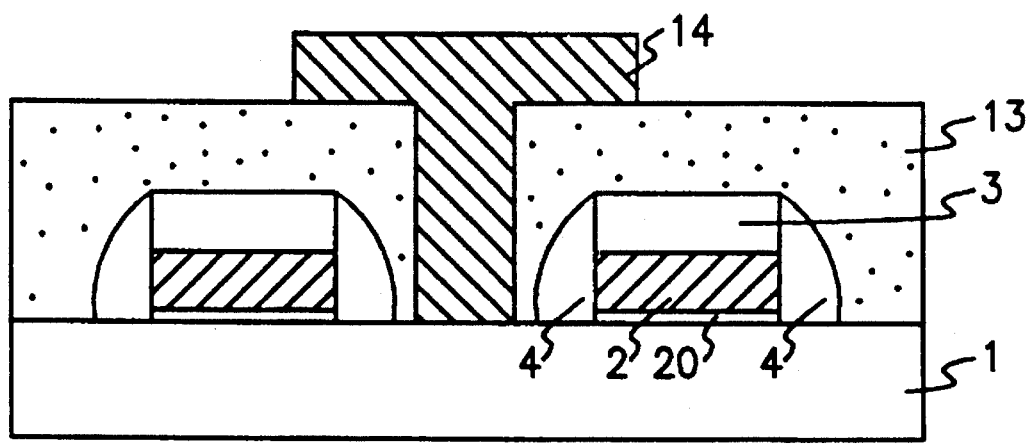
Figure 1C:
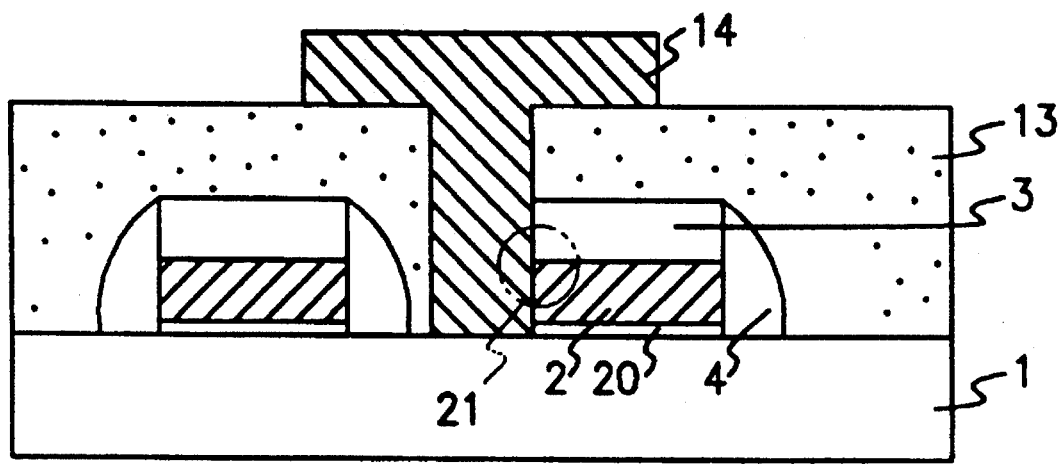

The present invention pertains to technology which is capable of forming the contacts of a bit line and/or a charge storage electrode between gate electrodes in a semiconductor device as well as securing an allowance enough to prevent the formation of a short circuit between the contacts and the gates.

The application of the preferred embodiments of the present invention is best understood with reference to the accompanying drawings, wherein like reference numerals are used for like and corresponding parts, respectively.

Referring initially to FIGS. 2A through 2G, there is illustrated a method according to one embodiment of the present invention.

Figure 2A:
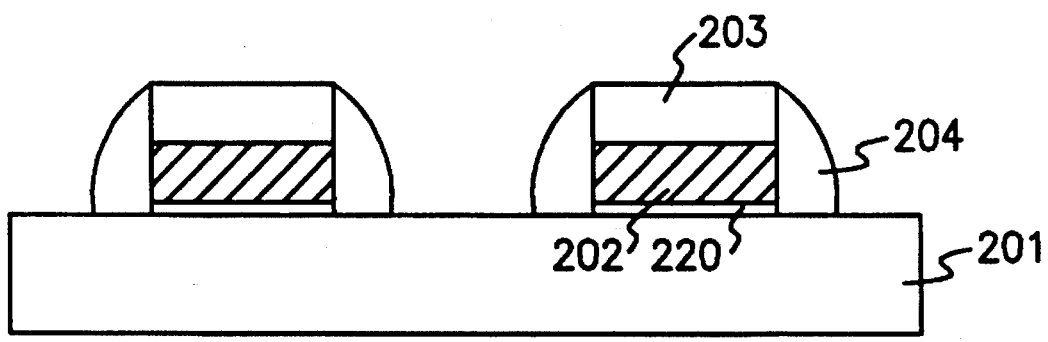
FIGS. 2A through 2G are schematic cross sectional views illustrating a formation method steps for a contact, according to an embodiment of the present invention.

In a FIG. 2A, there is shown a typical MOSFET structure of semiconductor device comprising a silicon substrate 201 covered with a pattern of a gate electrode 202 which is shielded by various insulating films including a gate insulating film 220, a first insulating film 203 and a spacer insulating film 204. The spacer insulating film 204 is formed by forming an insulating layer entirely on the substrate (resulting structure) and etching the insulating layer. When etching, an area of the silicon substrate is exposed which becomes an active region.

Figure 2B:
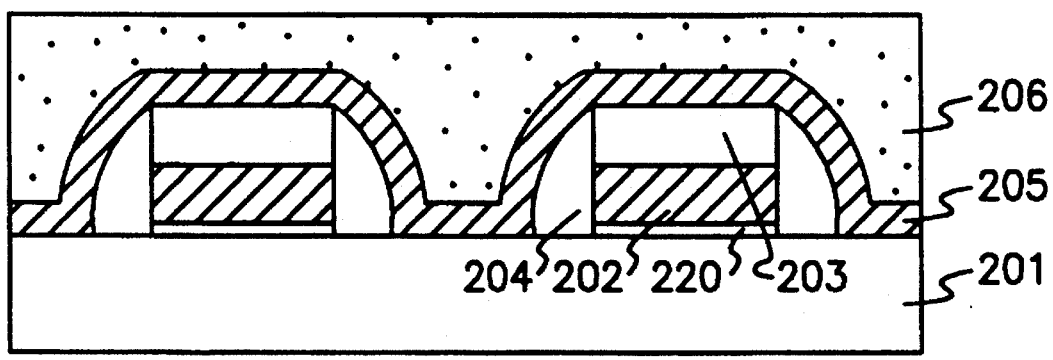

FIG. 2B shows a cross section of the semiconductor device after the MOSFET structure is entirely covered with a first silicon film 205 which is contacted with the exposed area of the silicon substrate 201 in a self-alignment manner, followed by planarization with a second insulating film 206.

Figure 2C:
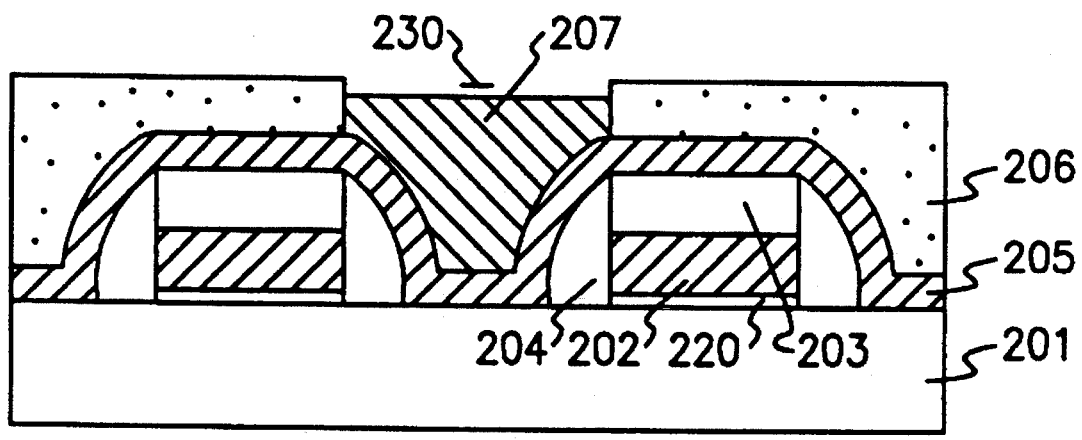

FIG. 2C shows a cross section of the semiconductor device after the second insulating film 206 is etched with a predetermined mask to expose a predetermined area of the first silicon film 205 followed by deposition of a selective metal film 207 on the exposed area of the first silicon film 205. The mask employed in this step has a predetermined allowance regardless of the width of the contacted area. That is, the mask may have a considerable allowance even in a highly integrated semiconductor device, according to the present invention.

As the selective metal film 207 is deposited on the first silicon film 205, there is employed tungsten (W) which is selectively formed only on a silicon film. Alternatively a silicide film such as a tungsten silicide ($WSi_2$) film or another conductive film such as polysilicon may be formed on the exposed area 230 of the first silicon film 205.

Figure 2D:
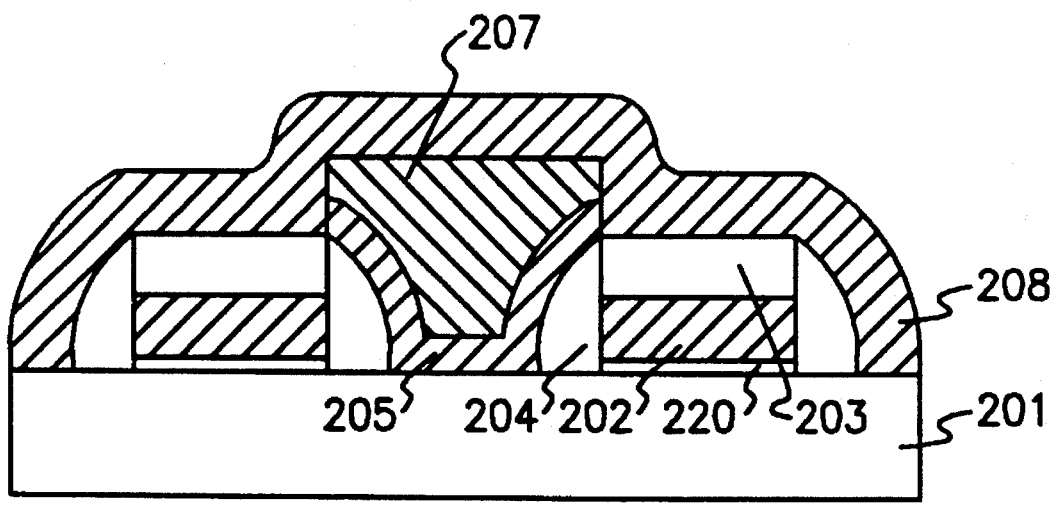

FIG. 2D shows a cross section of the semiconductor device after the second insulating film 206 is removed and the first silicon film 205 is subjected to etch with the selective metal film 207 serving as an etch stopper followed by the formation of a second silicon film 208.

Figure 2E:
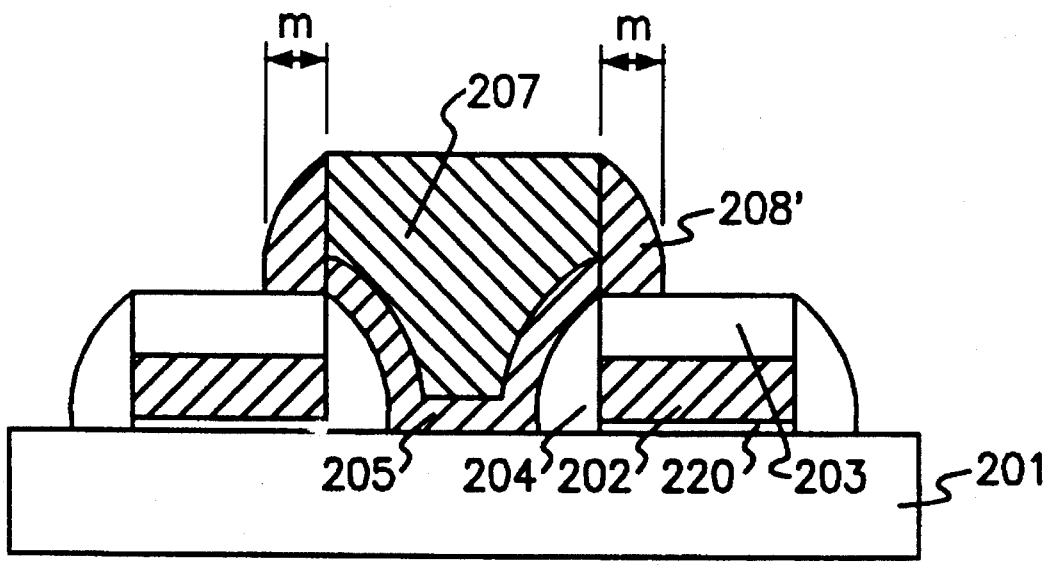

FIG. 2E shows a cross section of the semiconductor device after the second silicon film 208 is subjected to anisotropic dry etch, to form a spacer silicon film 208' which plays an important role in securing allowance. As shown in this figure, it adds its width m to the allowance useful to carry out a mask process.

Figure 2F:
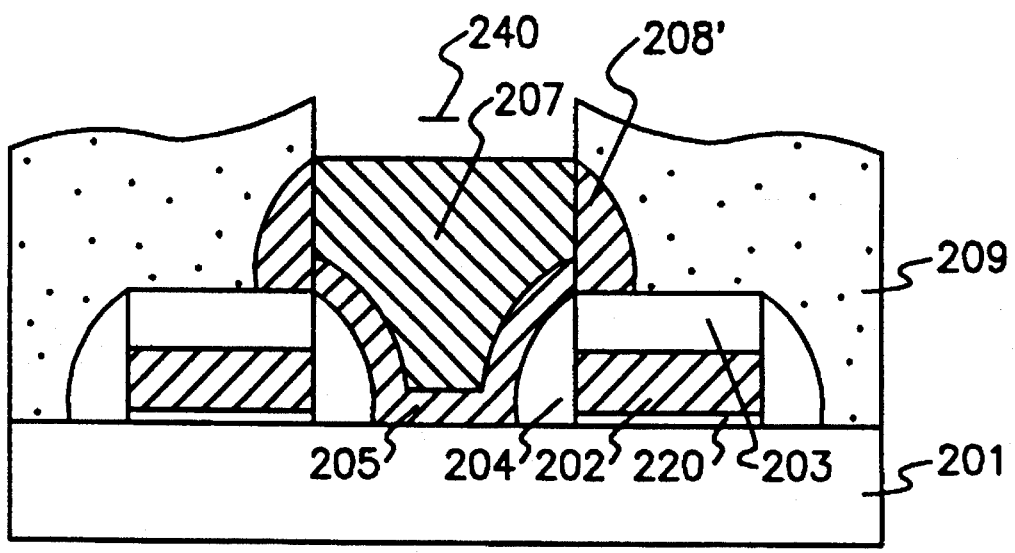

FIG. 2F shows a cross section of the semiconductor device after a third insulating film 209 is formed entirely over the resulting structure and then etched, to form a contact window 240 above the selective metal film 207. Etching of the third insulating film 209 is performed by use of the same mask as is employed to etch the second insulating film 206 with enough allowance.

Figure 2G:
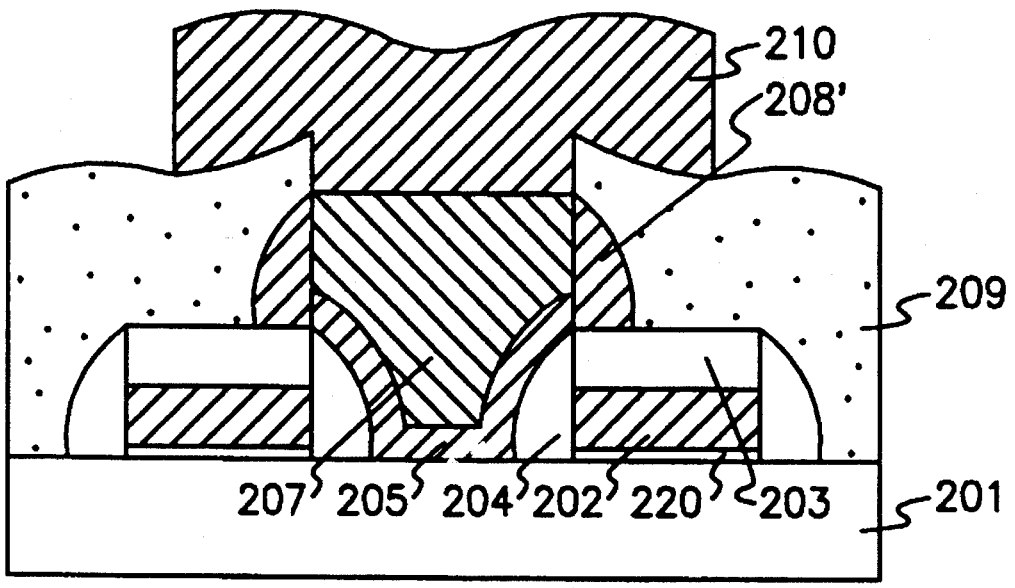

FIG. 2G shows a cross section of the semiconductor device after a polysilicon or metal film 210 is formed entirely over the resulting structure of FIG. 2F and then etched with a predetermined mask in such a manner to leave it over the contact window 240. As shown in this figure, this resulting contact is free of the short circuit with the gate and can be formed with the allowance given as enough as the width of the spacer silicon film 208'.

Figure 3:
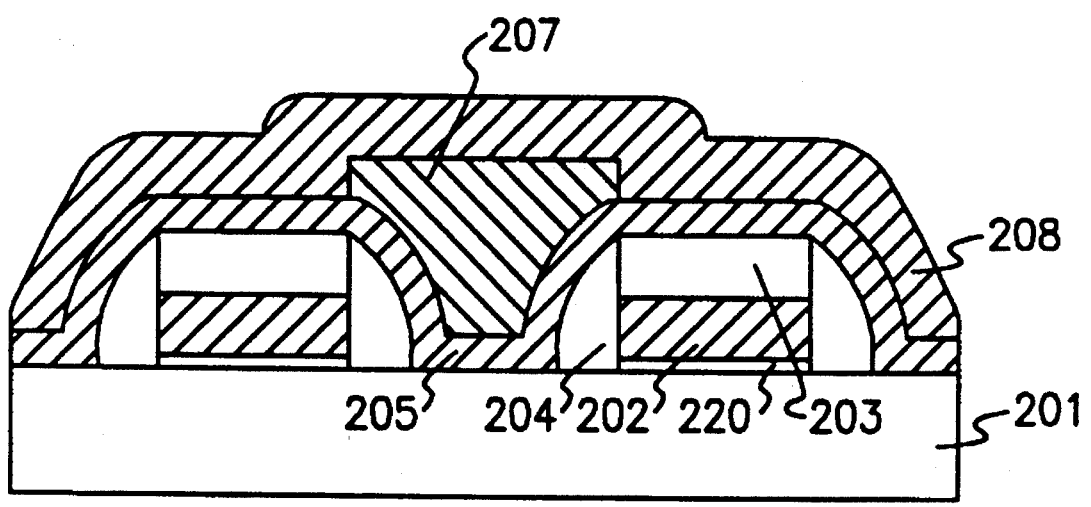
FIG. 3 is a schematic cross sectional view illustrating a formation method steps for a contact, according to another embodiment of the present invention.

Referring now to FIG. 3, there is partly illustrated a method according to another embodiment of the present invention. The processes illustrated in this figure are substituted for those illustrated in FIG. 2D. That is to say, subsequent to the processes of FIG. 2C, the second insulating film 206 is removed and then, a second silicon film 208 is formed entirely without subjecting the first silicon film 205 to etch. According to another embodiment of the present invention, the subsequent processes to form the contact are carried out in the same manner as those illustrated with reference to FIG. 2E through 2G, except that the second silicon film 208 is subjected to an anisotropic dry etch, to form a spacer silicon film 208' at a side wall of the selective metal film 207 and then, the resulting exposed area of the first silicon film 205 is removed by etch.

Figure 4A:
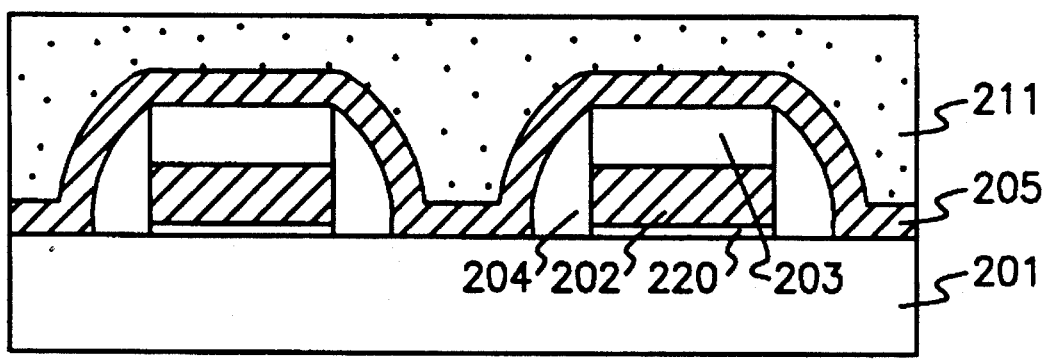
FIGS. 4A through 4C are schematic cross sectional views illustrating a formation method for contact, in part, according to a further embodiment of the present invention.
Figure 4B:
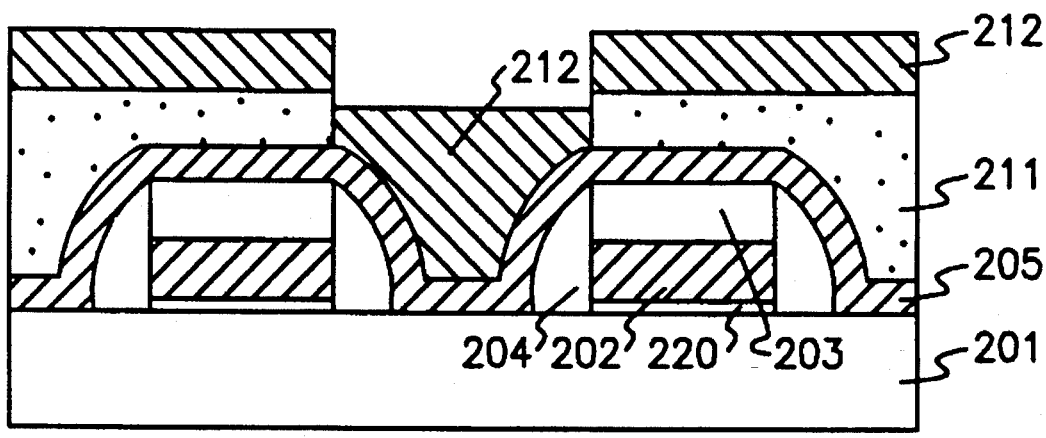
Figure 4C:
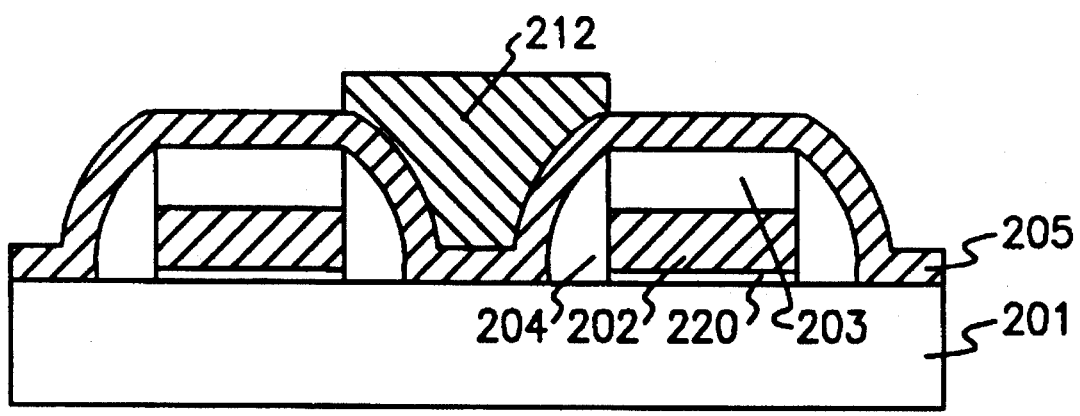

Turning to FIG. 4A through 4C, there is partly illustrated a method according to a further embodiment of the present invention.

First, FIG. 4A is the same as FIG. 2B, except that a photosensitive film 211 is formed instead of the second insulating film 206.

FIG. 4B shows a cross section after the photosensitive film is etched with a predetermined mask to expose an area of the first silicon film 205, followed by formation of a metal film 212 on the resulting structure. At the moment, the first metal film formed on the exposed area of the first silicon film 205 is not connected with that on the photosensitive film 211. In other words, the metal film 212 is discontinuous at the stepped parts of the contact window, according to the present invention. For this discontinuity, a metal with a low deposition rate, such as aluminum (Al), aluminum-titanium-aluminum (Al—Ti—Al), aluminum-copper (Al—Cu), tungsten (W), titanium (Ti) and titanium nitride (TiN) is used.

FIG. 4C shows a cross section after a lift-off process is carried out. While removing the remaining photosensitive film 211, the lift-off process expels the metal film 212 only formed on the remaining photosensitive film 211 with the metal film 212 formed on the exposed area of the first silicon 205 being left.

In this embodiment, subsequent processes are the same as those illustrated in FIGS. 2D through 2G.

As described hereinbefore, the present invention is characterized in that a first contact mediator is formed in self-alignment and then, a second contact mediator with sufficient allowance is formed. The methods according to the present invention can be applied for the contacts of bit line and charge storage electrodes. In addition, they can prevent the contact from having a short circuit with the gate electrode even in a highly integrated semiconductor device having a very short distance between the gate electrodes. Consequently, the methods according to the present invention can bring a remarkable improvement to the production yield and degree of integration.

Other features, advantages and embodiments of the invention disclosed herein will be readily apparent to those exercising ordinary skill after reading the foregoing disclosures. In this regard, while specific embodiments of the invention have been described in considerable detail, variations and modifications of these embodiments can be effected without departing from the spirit and scope of the invention as described and claimed.

What is claimed is:

1. A method for forming a contact in a semiconductor device having a substrate and at least a plurality of conductive film patterns, each of the conductive film patterns including a first conductive film having upper and lower surfaces, the first conductive films being insulated along at least the lower surfaces, in order to insulate the first conductive films from the substrate, the conductive film patterns including a top side and outside and inside lateral sides, the top side intermediate the lateral sides, the conductive film patterns being arranged on the substrate with their inside lateral sides adjacent to each other, the method comprising:

applying a first insulating film over the substrate, the portions of the first insulating film at the inside and outside lateral sides of the conductive film patterns defining insulating inside and outside spacers respectively, and removing at least a portion of the first insulating film between the inside spacers of the conductive film patterns, exposing a portion of the substrate;

depositing a second conductive film on the substrate, such that at least a portion of the second conductive film contacts the exposed substrate between the inside spacers;

depositing a second insulating film on the substrate;

removing a portion of the second insulating film intermediate the conductive film patterns to expose a portion of the second conductive film;

depositing a third conductive film on the exposed portion of the second conductive film;

removing substantially all of the second insulating film remaining and the second conductive film lying under the remaining second insulating film;

depositing a fourth conductive film on the substrate;

removing oppositely disposed portions of the forth conductive film that extend along the at least a portion of top side and outside spacers of the respective conductive film patterns;

depositing a third insulating film on the substrate;

removing a portion of the third insulating film to expose at least a portion of the fourth conductive film; and depositing a fifth conductive film on the exposed portion of the fourth conductive film.

2. The method of claim 1, wherein the second conductive film is a silicon film.

3. The method of claim 1, wherein the third conductive film is selected from the group consisting of Tungsten, Tungsten silicide and polysilicon.

4. A method for forming a contact in a semiconductor device having a substrate and at least a plurality of conductive film patterns, each of the conductive film patterns including a first conductive film having upper and lower surfaces, the first conductive films being insulated along at least the lower surfaces, in order to insulate the first conductive films from the substrate, the conductive film patterns including a top side and outside and inside lateral sides, the top side intermediate the lateral sides, the conductive film patterns being arranged on the substrate with their inside lateral sides adjacent to each other, the method comprising:

applying a first insulating film over the substrate, the portions of the first insulating film at the inside and outside lateral sides of the conductive film patterns defining insulating inside and outside spacers respectively, and removing at least a portion of the first insulating film between the inside spacers of the conductive film patterns, exposing a portion of the substrate;

depositing a second conductive film on the substrate, such that at least a portion of the second conductive film contacts the exposed substrate between the inside spacers;

depositing a second insulating film on the substrate;

removing a portion of the second insulating film intermediate the conductive film patterns to expose a portion of the second conductive film;

depositing a third conductive film on the exposed portion of the second conductive film;

removing substantially all of the second insulating film remaining;

depositing a fourth conductive film on the substrate;

anisotropically etching the fourth conductive film to form spacer conducting films oppositely disposed on the third conductive film and in contact with portions of the second and third conductive films;

depositing a third insulating film on the substrate;

removing a portion of the third insulating film to expose at least a portion of the fourth conductive film; and depositing a fifth conductive film on the exposed portion of the fourth conductive film.

5. The method of claim 4, wherein the second conductive film is a silicon film.

6. The method of claim 4, wherein the third conductive film is selected from the group consisting of Tungsten, Tungsten silicide and polysilicon.

7. A method for forming a contact in a semiconductor device having a substrate and at least a plurality of conductive film patterns, each of the conductive film patterns including a first conductive film having upper and lower surfaces, the first conductive films being insulated along at least the lower surfaces, in order to insulate the first conductive films from the substrate, the conductive film patterns including a top side and outside and inside lateral sides, the top side intermediate the lateral sides, the conductive film patterns being arranged on the substrate with their inside lateral sides adjacent to each other, the method comprising:

applying a first insulating film over the substrate, the portions of the first insulating film at the inside and outside lateral sides of the conductive film patterns defining insulating inside and outside spacers respectively, and removing at least a portion of the first insulating film between the inside spacers of the conductive film patterns, exposing a portion of the substrate;

depositing a second conductive film on the substrate, such that at least a portion of the second conductive film contacts the exposed substrate between the inside spacers;

depositing a photosensitive film on the substrate;

removing a portion of the photosensitive film intermediate the conductive film patterns to expose a portion of the second conductive film;

depositing a third conductive film on the substrate such that portions of the third conductive film are formed on the exposed second conductive film and on the photosensitive film portions remaining on the substrate, wherein the portion of the third conductive film formed on the exposed second conductive film is not connected with portions of the third conductive film formed on the remaining photosensitive film;

removing substantially all of the remaining photosensitive film, the third conductive film portions on the photosensitive film, and the second conductive film lying under the remaining photosensitive film;

depositing a fourth conductive film on the substrate;

removing oppositely disposed portions of the fourth conductive film that extend along the at least a portion of top side and outside spacers of the respective conductive film patterns;

depositing a second insulating film on the substrate;

removing a portion of the second insulating film to expose at least a portion of the fourth conductive film; and depositing a fifth conductive film on the exposed portion of the fourth conductive film.

8. The method of claim 7, wherein the third conductive film is selected from the group consisting of aluminum, aluminum-titanium-aluminum, tungsten, titanium, and titanium-nitride.

* * * * *

UNITED STATES PATENT AND TRADEMARK OFFICE
CERTIFICATE OF CORRECTION

PATENT NO. : 5,527,738

DATED : June 18, 1996

INVENTOR(S) : Koh et al.

It is certified that error appears in the above-identified patent and that said Letters Patent is hereby corrected as shown below:

Column 1, line 12, "device" should read --devices--

Signed and Sealed this

Fourth Day of February, 1997

Attest:

BRUCE LEHMAN

*Attesting Officer*  Commissioner of Patents and Trademarks